(12) United States Patent
Shibata et al.

(10) Patent No.: US 8,084,925 B2
(45) Date of Patent: Dec. 27, 2011

(54) PIEZOELECTRIC THIN FILM ELEMENTAL DEVICE, SENSOR AND ACTUATOR

(75) Inventors: Kenji Shibata, Tsukuba (JP); Fumihito Oka, Hitachi (JP); Kazufumi Suenaga, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 466 days.

(21) Appl. No.: 12/427,348

(22) Filed: Apr. 21, 2009

(65) Prior Publication Data
US 2009/0302715 A1 Dec. 10, 2009

(30) Foreign Application Priority Data

Jun. 5, 2008 (JP) ................................ 2008-147901

(51) Int. Cl.
*H01L 41/08* (2006.01)
(52) U.S. Cl. ....................................... 310/358; 310/311
(58) Field of Classification Search .................. 310/358, 310/357, 311, 328, 330, 346, 359; 252/62.9 PZ, 252/62.9 R
See application file for complete search history.

(56) References Cited

U.S. PATENT DOCUMENTS

| | | | |
|---|---|---|---|
| 7,145,285 B2 | 12/2006 | Torii et al. | |
| 7,323,806 B2 * | 1/2008 | Shibata et al. | 310/358 |
| 7,518,293 B2 * | 4/2009 | Shibata et al. | 310/358 |
| 7,701,121 B2 * | 4/2010 | Oka et al. | 310/358 |
| 7,732,996 B2 * | 6/2010 | Shibata et al. | 310/358 |
| 2005/0127795 A1 | 6/2005 | Torii et al. | |

FOREIGN PATENT DOCUMENTS

JP 2005-203725 A 7/2005

* cited by examiner

*Primary Examiner* — Thomas Dougherty
*Assistant Examiner* — Karen B Addison
(74) *Attorney, Agent, or Firm* — Martin Fleit; Paul D. Bianco; Fleit Gibbons Gutman Bongini & Bianco PL (57) ABSTRACT

A piezoelectric thin film element has a piezoelectric thin film on a substrate, the piezoelectric thin film has a $(K_{1-x}Na_x)NbO_3$ thin film expressed by a compositional formula $(K_{1-x}Na_x)NbO_3 (0 < x < 1)$ with a perovskite structure, and a ratio of an out-of-plane directional lattice constant c to an in-plane directional lattice constant a of the thin film is in a range of $0.98 \leq c/a \leq 1.01$.

20 Claims, 6 Drawing Sheets

PIEZOELECTRIC THIN FILM ELEMENTAL DEVICE, SENSOR AND ACTUATOR

BACKGROUND

1. Technical Field

The present invention relates to a piezoelectric thin film elemental device using a piezoelectric thin film, and further specifically relates to the piezoelectric thin film elemental device having the piezoelectric thin film of an alkali niobate base perovskite structure on a silicon substrate, and to a sensor and an actuator using the piezoelectric thin film elemental device.

2. Description of Related Art

A piezoelectric substance is processed into various piezoelectric elemental devices according to various purposes, and is widely utilized as functional electronic components such as an actuator in particular for operating the piezoelectric elemental device by adding voltage thereto, thereby generating deformation, and reversely a sensor for detecting a physical amount from the voltage generated from the deformation of the piezoelectric elemental device. As the piezoelectric substance utilized for the purpose of use of the actuator and the sensor, a dielectric substance made of a lead-based material having excellent piezoelectric characteristics, and particularly a PZT-based perovskite ferroelectric expressed by a compositional formula: $Pb(Zr_{1-x}Ti_x)O_3$ called PZT has been widely used heretofore, which is normally formed by sintering an oxide composed of individual elemental devices.

At present, as downsizing and higher performance of each kind of electronic component is progressed, the downsizing and higher performance is also required in the piezoelectric elemental device. However, in a piezoelectric material manufactured by a manufacturing method typified by a sintering method, being a method performed conventionally, as its thickness becomes thinner, particularly as the thickness becomes closer to the thickness of about 10 μm, this thickness becomes closer to the size of a crystal grain constituting the material, and its influence can not be ignored. This involves a problem that variation and deterioration of the characteristics is remarkable, and in order to avoid this problem, a forming method of the piezoelectric substance applying a thin film technique in place of the sintering method has been studied in recent years. In recent years, a PZT thin film formed on a silicon substrate by a sputtering method is put to practical use as a piezoelectric thin film for a supersensitive gyroscope (angular velocity sensor) (for example, see patent document 1).

Meanwhile, a piezoelectric sintering body and the piezoelectric thin film composed of PZT contains about 60 to 70 wt % of lead, and this is not preferable from an ecological viewpoint and from an aspect of pollution control. Therefore, development of the piezoelectric substance not containing lead is desired from the consideration of an environment.

Currently, various non-lead piezoelectric materials have been examined, and among them, sodium potassium niobate expressed by a compositional formula: $(K_{1-x}Na_x)NbO_3$ (0<x<1) (referred to as KNN hereafter in some cases) is given as an example. The KNN is a material having a perovskite structure, showing relatively excellent piezoelectric characteristics as a non-lead material, and therefore is expected as a dominant candidate of the non-lead piezoelectric material. (Patent document 1)
Japanese Patent Laid Open Publication No. 2005-203725

Deposition of the KNN thin film on the silicon substrate is tested, by a deposition method such as a sputtering method and a PLD, being a pulsed laser deposition method, or a laser ablation method, and in some cases, there is a report that piezoelectric constant $d_{31}$=-100 pm/V, being the characteristic of a practicable level is realized. However, the piezoelectric constant is approximately $d_{31}$=70 to -75 pm/V, if reproducibility and characteristic variation in a substrate surface is taken into consideration.

The piezoelectric constant $d_{31}$ of the PZT thin film currently used in a product is about -90 to -100 pm/V, and if compared with this value, the piezoelectric constant $d_{31}$ of the KNN thin film is still in a state of a small value. In order to widely apply the KNN thin film to an ink jet printer head, and so forth, the piezoelectric constant $d_{31}$ must be improved up to -90 pm/V or more.

SUMMARY OF THE INVENTION

An object of the present invention is to provide a piezoelectric thin film elemental device using a KNN piezoelectric thin film having piezoelectric characteristics that it can be substituted for the PZT thin film having excellent piezoelectric characteristics, and a sensor and an actuator using the piezoelectric thin film elemental device.

According to an aspect of the present invention, a piezoelectric thin film elemental device is provided, comprising: a piezoelectric thin film on a substrate, wherein the piezoelectric thin film has a $(K_{1-x}Na_x)NbO_3$ thin film expressed by a compositional formula $(K_{1-x}Na_x)NbO_3$ (0<x<1) with a perovskite structure, and a ratio of an out-of-plane directional lattice constant c to an in-plane directional lattice constant a of the thin film is in a range of $0.98 \leq c/a \leq 1.01$.

Further, the x, being a composition ratio of Na, may be in a range of $0.3 \leq x \leq 0.7$.

According to other aspect of the present invention, the piezoelectric thin film elemental device is provided, wherein a tensile stress is added to the piezoelectric thin film, and the ratio of the $(K_{1-x}Na_x)NbO_3$ thin film is in a range of $0.980 \leq c/a \leq 0.993$.

According to other aspect of the present invention, the piezoelectric thin film elemental device is provided, wherein a compression stress is added to the piezoelectric thin film, and the ratio of the $(K_{1-x}Na_x)NbO_3$ thin film is in a range of $1.004 \leq c/a \leq 1.010$.

DESCRIPTION OF PREFERRED EMBODIMENTS OF THE INVENTION

An embodiment of a piezoelectric thin film elemental device according to the present invention will be described by using the drawings.

(Structure of the Piezoelectric Thin Film Elemental Device of This Embodiment)

Figure 1:
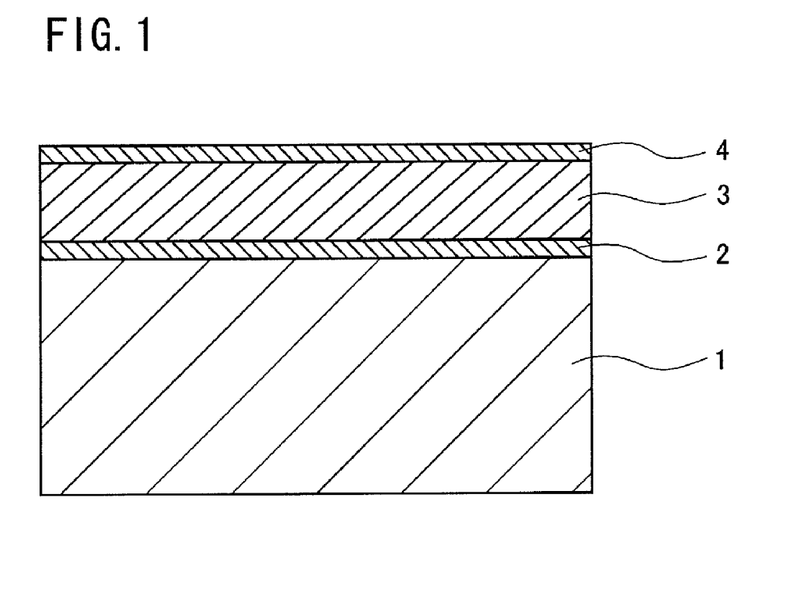
FIG. 1 is a sectional view schematically illustrating a piezoelectric thin film elemental device according to an embodiment of the present invention.

FIG. 1 is a sectional view illustrating a schematic structure of the piezoelectric thin film elemental device of this embodiment. As shown in FIG. 1, the piezoelectric thin film elemental device has a lower electrode 2, a KNN piezoelectric thin film 3, and an upper electrode 4 sequentially layered on a Si (silicon) substrate 1.

A (100) Si substrate with its surface set in a (100) plane direction (direction vertical to (100) plane, and also called [100] direction) is, for example, used as a Si substrate 1. It may also be preferable that an oxide film ($SiO_2$ film) is formed on a surface of the Si substrate 1, and the lower electrode 2 and the Si substrate are electrically insulated.

The lower electrode 2 becomes an important substrate layer on which the KNN piezoelectric thin film 3 is formed. Therefore, Pt (platinum) or Au (gold) are preferably used as an electrode material. In this embodiment, the lower electrode 2 composed of a Pt thin film is formed by using an RF magnetron sputtering technique. Note that even in a case of the lower electrode composed of an Au thin film also, the KNN piezoelectric thin film similar to the Pt lower electrode can be formed. The Pt film formed on the Si substrate is easily oriented in a (111) plane direction, due to its self-orientation. Note that it may be also preferable to provide a Ti adhesive layer between the Si substrate 1 and the lower electrode 2, to improve adhesiveness of the lower electrode 2.

The upper electrode 4 is an electrode formed on the KNN piezoelectric thin film 3, and the structure of the piezoelectric thin film 3 is not greatly influenced by this upper electrode 4, unlike the lower electrode 2. Therefore, a material of the upper electrode 4 is not particularly limited. In this embodiment, in the same way as the lower electrode 2, the upper electrode 4 is formed on the Pt thin film by the RF magnetron sputtering technique.

(A Manufacturing Method and a Structure of the KNN Piezoelectric Thin Film)

The KNN piezoelectric thin film 3 is a thin film having an alkali niobate base perovskite structure expressed by a compositional formula $(K_{1-x}Na_x)NbO_3$ (0<x<1). Sputtering, CVD, PLD, and Sol-Gel processing are given as examples of the forming method of the KNN piezoelectric thin film 3. In this embodiment, the KNN piezoelectric thin film 3 is formed by using the RF magnetron sputtering technique.

The KNN piezoelectric thin film 3 is fabricated, so that the c/a ratio of the out-of-plane directional lattice constant c to the in-plane directional lattice constant a is within $0.98 \leq c/a \leq 1.01$.

Figure 2:
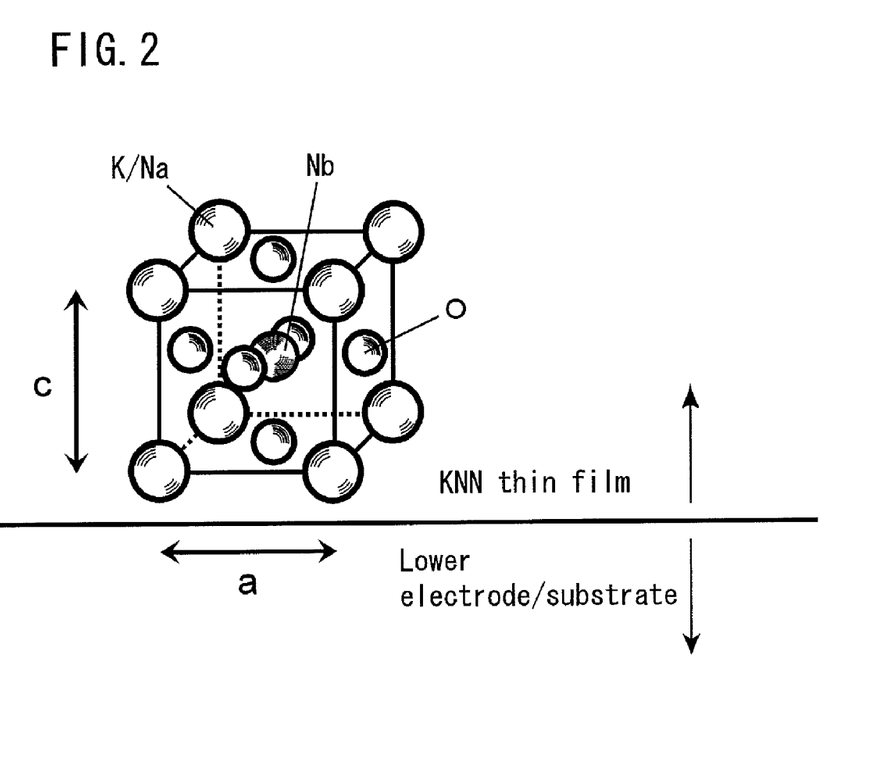
FIG. 2 is an explanatory view regarding in-plane directional lattice constant a and out-of-plane directional lattice constant c of the KNN thin film on a substrate.

Here, as shown in FIG. 2, the out-of-plane directional lattice constant "c" is a lattice constant of the KNN thin film in a direction (out-of-plane direction) vertical to the surface of a substrate (Si substrate 1) and the surface of the KNN thin film (KNN piezoelectric thin film 3), and the in-plane directional lattice constant "a" is the lattice constant of the KNN thin film in a direction (in-plane direction) parallel to the surface of the substrate (Si substrate 1) and the surface of the KNN thin film (KNN piezoelectric thin film 3).

FIG. 2 illustrates a crystal structure of the KNN thin film having the perovskite structure. Namely, as shown in the figure, the KNN thin film has cubic, tetragonal, orthorhombic crystal lattice, and K(potassium) or Na(sodium) are arranged in each vertex of the cubic, tetragonal, and orthorhombic crystal lattice, and O(oxygen) is arranged in each face center, and Nb(niobium) is arranged in each body center.

(Relation between the C/A ratio and the piezoelectric characteristics of the KNN piezoelectric thin film)

As a result of performing various examinations by the inventors of the present invention, as shown in tables 1 to 3 and FIG. 10 as will be described later, it is found that when the c/a ratio of the KNN thin film (KNN piezoelectric thin film 3) is in the range of $0.98 \leq c/a \leq 1.01$, the KNN thin film having high piezoelectric constant $d_{31}$ can be obtained. When the c/a ratio is in the range of $0.98 \leq c/a \leq 1.01$, the KNN thin film is set in an almost cubic (pseudo cubic) state, which seems to be a state in which the stress added to the KNN thin film is small.

When the c/a ratio is in this range, largest piezoelectric effect is exhibited (see FIG. 10), and it is possible to realize the KNN piezoelectric thin film satisfying the piezoelectric constant $d_{31} = -90$ pm/V or more required in application for the ink jet printer.

Note that in the examination performed heretofore, regarding the KNN thin film on the substrate in an ideal crystal state of the KNN thin film with extremely small stress, it is not clarified whether the in-plane directional lattice constant a and the out-of-plane directional lattice constant c are configured to be almost coincident to each other, or whether the out-of-plane lattice constant c is greater than the in-plane directional lattice constant a in a state of extending in an out-of-plane direction (vertically long state), or whether the in-plane directional lattice constant a is greater than the out-of-plane directional lattice constant c in a state of extending in a in-plane direction (horizontally long state). In addition, the relation between the c/a ratio and the piezoelectric constant of the KNN thin film is not known at all.

When the c/a ratio is larger than 1.01, namely, when it is estimated that a great compression stress is added to the KNN thin film, the piezoelectric constant $d_{31}$ becomes low. This is because the crystal of the KNN thin film is already extended in an electric field applying direction (direction in which the crystal is extended by the piezoelectric effect, and the out-of-plane direction in FIG. 2), and therefore even if the electric field is applied, the crystal can not be extended effectively.

Meanwhile, when the c/a ratio is smaller than 0.98, namely, when it is estimated that a great tensile stress is added to the KNN thin film, the piezoelectric constant $d_{31}$ becomes small. In this case, since the KNN crystal is the crystal extending in the in-plane direction, polarization axis is directed sideways (in-plane direction). Even if the electric field is applied to the KNN thin film in the out-of-plane direction in this state, extension of the crystal (lattice extension) by the electric field hardly occurs, because the electric field applying direction is vertical to the polarization axis. As a result, the piezoelectric constant $d_{31}$ becomes small.

Note that in a case of a KNN sintering body, it is known that a significantly great piezoelectric displacement occurs due to 90° domain rotation, when a high electric field vertical to the polarization axis is applied. However, in a case of the KNN thin film, a large constraint force works from the substrate (Si substrate 1), and therefore the aforementioned 90° domain rotation does not occur.

(Control of the c/a Ratio of the KNN Piezoelectric Thin Film)

The c/a ratio of the KNN piezoelectric thin film 3 can be controlled by changing a magnitude of the stress added to the KNN piezoelectric thin film 3. The stress added to the KNN piezoelectric thin film 3 mainly occurs by a difference of a thermal expansion coefficient between the KNN piezoelectric thin film 3 and the Si substrate 1. The KNN piezoelectric thin film 3 is deposited on the Si substrate 1 at a relatively high temperature by the sputtering method, etc. Thereafter, the stress is added to the KNN piezoelectric thin film 3 from the Si substrate 1 when the temperature is lowered to a room temperature, because there is the difference of the thermal expansion coefficient between the Si substrate 1 and the KNN piezoelectric thin film 3.

The magnitude of the stress added to the KNN thin film (KNN piezoelectric thin film 3) can be controlled/changed by changing the thermal expansion coefficient in the in-plane direction of the KNN thin film, specifically by changing an orientation state of the KNN thin film and Na composition (Na/(K+Na) composition is called the Na composition in this specification). Alternately, the magnitude of the stress added to the KNN thin film can be controlled/changed by changing a temperature history, specifically by changing a deposition temperature of the KNN thin film, and by executing annealing process after deposition.

Figure 7:
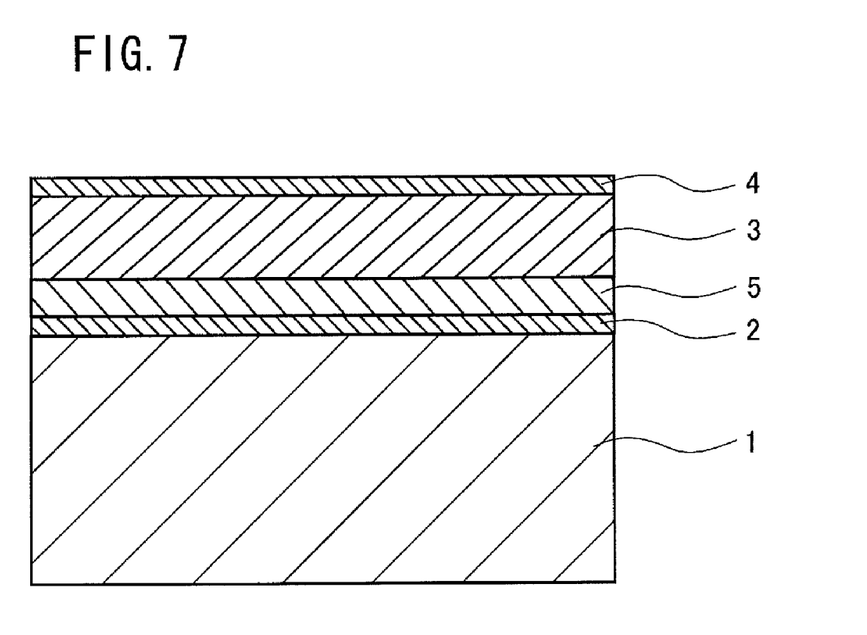
FIG. 7 is a schematic sectional view illustrating a structure of a piezoelectric thin film elemental device according to other embodiment of the present invention.

Also, in order to change the magnitude of the stress added to the KNN thin film (KNN piezoelectric thin film 3), as shown in FIG. 7, it may be also acceptable to provide a stress relaxation layer 5 having the perovskite structure and having the lattice constant different from that of the KNN piezoelectric thin film 3, between the lower electrode 2 and the KNN piezoelectric thin film 3. As the stress relaxation layer 5, specifically it is preferable to provide the stress relaxation layer 5 composed of $LaNiO_3$, $SrTiO_3$, $LaAlO_3$, $YAlO_3$ having the lattice constant smaller than that of the KNN piezoelectric thin film 3 when the compression stress is added to the KNN piezoelectric thin film 3, to relax the compression stress of the KNN piezoelectric thin film 3. Meanwhile, when the tensile stress is added to the KNN piezoelectric thin film 3, it is preferable to provide the stress relaxation layer 5 composed of $BaZrO_3$, $BaSnO_3$, $BaMnO_3$ having the lattice constant larger than that of the KNN piezoelectric thin film 3, to relax the tensile stress of the KNN piezoelectric thin film 3.

(Calculation of the Out-of-Plane Directional Lattice Constant c and the In-Plane Directional Lattice Constant a)

The values of the out-of-plane directional lattice constant c and the in-plane directional lattice constant a of the KNN thin film in this specification are numerical values calculated from diffraction peak angle obtained by an X-ray diffraction pattern.

Detailed explanation will be given hereunder, for the calculation of the out-of-plane directional lattice constant c and the in-plane directional lattice constant a.

The KNN piezoelectric thin film (KNN thin film) 3 of this embodiment is formed on the lower electrode 2 of the Pt film. The Pt film is formed into poly crystal of a columnar structure, self-oriented in the (111) plane direction. Therefore, the KNN thin film takes over the crystal structure of this Pt film and is formed into a poly crystal thin film of the columnar structure having the perovskite structure. Namely, the KNN thin film is preferentially (001) oriented in the out-of-plane direction. However regarding the in-plane direction, the KNN thin film does not preferentially-oriented in a specific direction and is oriented at random.

Figure 3:
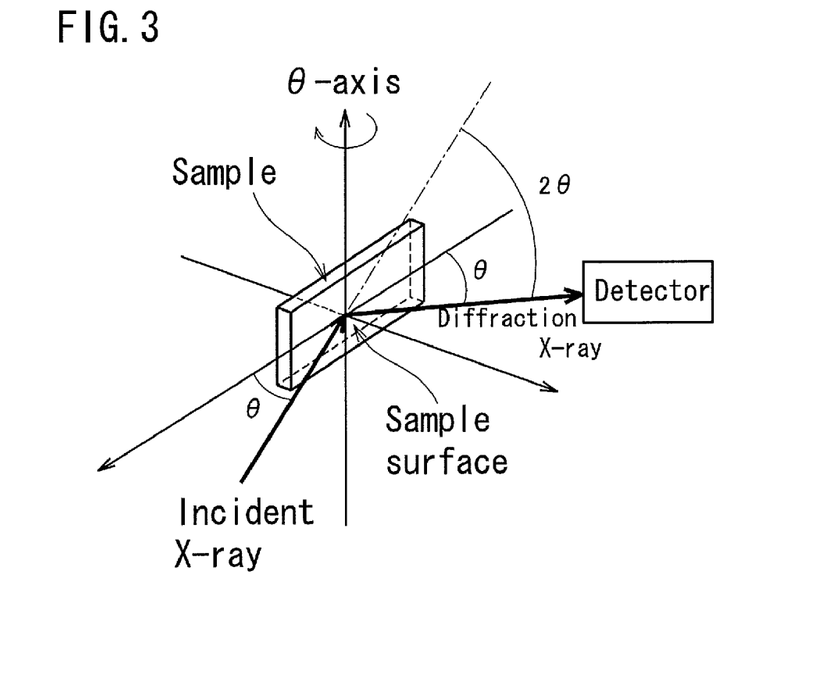
FIG. 3 is an explanatory view of an X-ray diffraction measurement by 2θ/θ method.

As described above, the KNN thin film having the perovskite structure is preferentially (001) oriented in the out-of-plane direction, and this state can be judged by diffraction peaks of the (001) plane and (002) plane, which are higher than other peaks caused by the KNN thin film, in the X-ray diffraction pattern (see FIG. 4) obtained at the time of performing the X-ray diffraction measurement (FIG. 3) of the KNN thin film by the 2θ/θ method. In this specification, the diffraction peak in a range of $22.011° \leq 2\theta \leq 22.890°$ is considered to be a (001) plane diffraction peak, and the diffraction peak in a range of $44.880° \leq 2\theta \leq 46.789°$ is considered to be a (002) plane diffraction peak, based on JCPDS-international Center for Diffraction Data of $KNbO_3$ and $NaNbO_3$.

The out-of-plane directional lattice constant c in this specification is calculated by the following method. First, the X-ray diffraction pattern was measured by normal X-ray diffraction measurement (2θ/θ method) shown in FIG. 3 using $CuK\alpha_1$ ray. In this X-ray diffraction measurement, normally a sample and a detector are scanned around the θ-axis shown in FIG. 3, and the diffraction from a lattice plane parallel to a sample plane is measured.

Figure 4:
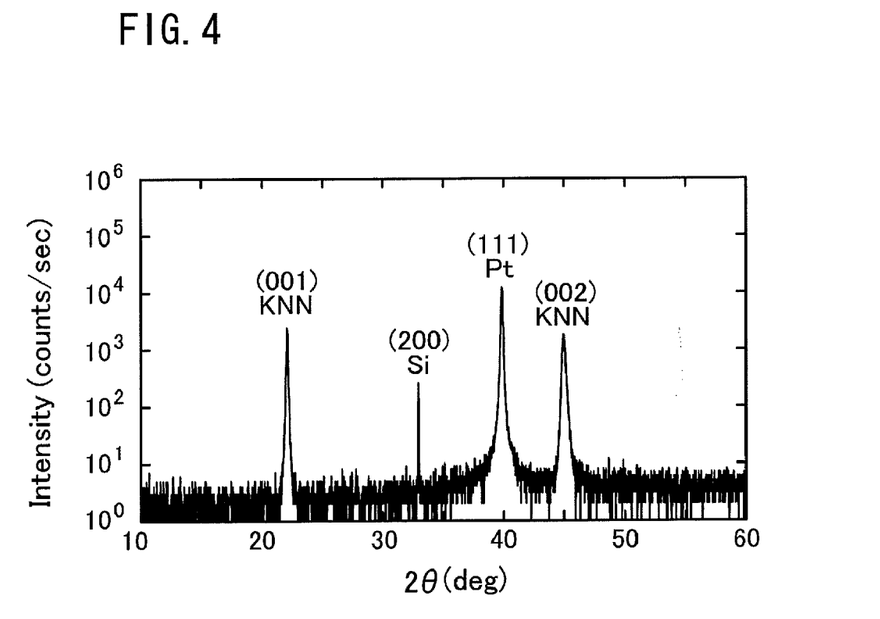
FIG. 4 is a graph showing an example of a measurement result of an X-ray diffraction pattern by the 2θ/θ method, performed to the KNN thin film of the example of the present invention.

The value of θ obtained from the angle 2θ of the diffraction peak of the KNN (002) plane in the obtained X-ray diffraction pattern (FIG. 4 shows an example of the X-ray diffraction pattern for the KNN thin film of an example as will be described later), and a wavelength λ=0.154056 nm of the $CuK\alpha_1$ ray are substituted into Bragg equation $2d \sin \theta = \lambda$, and lattice spacing $c_{(002)}$ (=c/2) of the KNN (002) was calculated. The value of twice the lattice spacing $c_{(002)}$ was set as the out-of-plane directional lattice constant c.

Figure 5:
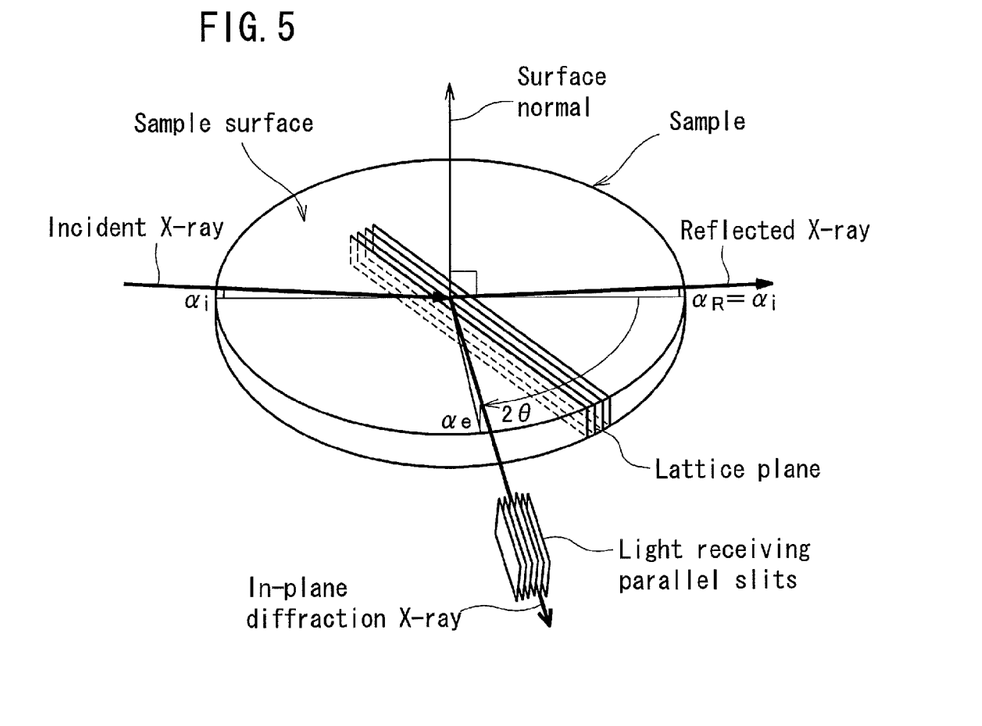
FIG. 5 is an explanatory view of the X-ray diffraction measurement by In-Plane method.

In addition, the in-plane lattice constant a in this specification was calculated by the following method. The X-ray diffraction pattern was measured by in-plane X-ray diffraction measurement using the $CuK\alpha_1$ ray shown in FIG. 5. In this X-ray diffraction measurement, normally in-plane rotation of a detector including light receiving parallel slits and a sample shown in FIG. 5 are carried out, and diffraction from a lattice face vertical to a sample plane is measured.

Figure 6:
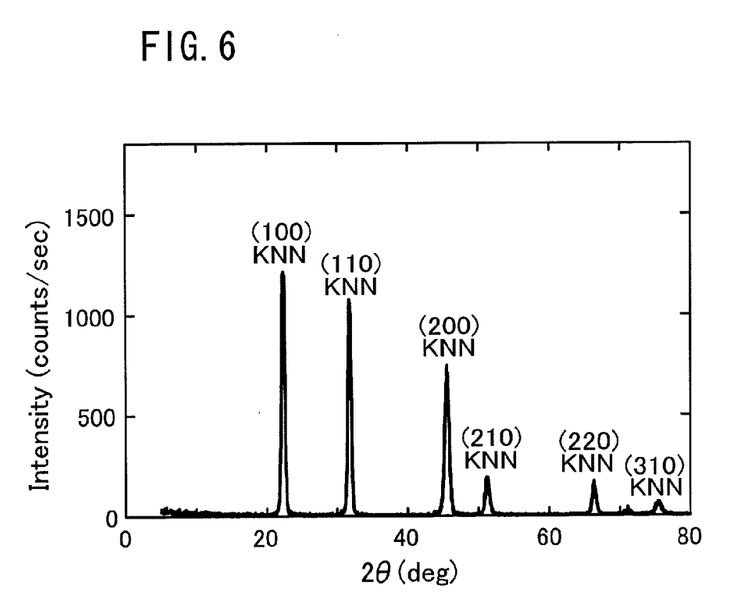
FIG. 6 is a graph illustrating an example of the measurement result of the X-ray diffraction pattern by the In Plane method, performed to the KNN thin film of the example of the present invention.

A value of θ obtained from a diffraction peak angle 2θ of a KNN (200) in the obtained X-ray diffraction pattern (an example of the X-ray diffraction pattern on the KNN thin film of an example as will be described later is shown in FIG. 6), and a wavelength λ=0.154056 nm of the $CuK\alpha_1$ ray are substituted into Bragg equation $2d \sin \theta = \lambda$, and a lattice spacing $a_{(002)}$ (=a/2) of the KNN (002) plane was calculated. The value of twice the lattice spacing $a_{(002)}$ was set as the in-plane directional lattice constant a. In this X-ray diffraction pattern by the in-plane X-ray diffraction also, the diffraction peak in a range of $44.880° \leq 2\theta \leq 46.789°$ is considered to be the (200) plane diffraction peak, based on the JCPDS-international Center for Diffraction Data of $KNbO_3$ and $NaNbO_3$.

When the obtained KNN thin film is not set in a single domain state of being present singularly in either one of a c-domain (an area where the crystal lattice extends in a direction of the out-of-plane directional lattice constant c) or an a-domain (an area where the crystal lattice extends in a direction of the in-plane directional constant a), but set in a tetragonal crystal where the c-domain and the a-domain are mixed, the KNN (200) diffraction peak is obtained in the vicinity of the KNN (002) diffraction peak in the 2θ/θ method X-ray diffraction pattern, and the KNN (002) diffraction peak is obtained in the vicinity of the KNN (200) diffraction peak in the in-plane X-ray diffraction pattern. In this case, according to this specification, the out-of-plane directional lattice constant c and the in-plane directional constant a are calculated by using a peak angle of a diffraction peak with greater peak intensity (namely a dominant domain), out of the two adjacent diffraction peaks.

In the measurement of the in-plane X-ray diffraction (grazing-incidence X-ray diffraction), only the area in the vicinity of the sample surface can be measured. Therefore, in the in-plane X-ray diffraction measurement of this embodiment, the measurement was performed, with an upper electrode not placed on the KNN thin film. When the upper electrode 4 is the sample formed on the KNN piezoelectric thin film 3 as shown in FIG. 1, this upper electrode 4 is removed by dry etching, wet etching, and polishing, to expose the surface of the KNN piezoelectric thin film 3, and thereafter the in-plane X-ray diffraction measurement is performed. When the upper electrode of Pt is removed, ion milling by Ar plasma and reactive ion etching in the mixed gas of Ar and $CF_4$ are given as examples of the dry etching.

(Application Example of the Piezoelectric Thin Film Elemental Device)

A sensor can be obtained by connecting at least a voltage detector between the lower electrode 2 and the upper electrode 4 of the piezoelectric thin film elemental device shown in FIG. 1. When the piezoelectric thin film elemental device of this sensor is deformed with some sort of change of a physical amount, a voltage is generated with this change, and therefore each kind of physical amount can be detected by detecting this voltage. Also, an actuator can be obtained by connecting at least a voltage applying means between the lower electrode 2 and the upper electrode 4 of the piezoelectric thin film elemental device shown in FIG. 1. Each kind of member can be operated by applying the voltage to the piezoelectric thin film of this actuator to deform this piezoelectric thin film elemental device.

A gyroscope, an ultrasonic sensor, a pressure sensor, a speed/acceleration sensor are given as examples of the sensor. Also, an ink-jet printer, a scanner, and an ultrasonic wave generation device, etc, can be used as examples of the actuator.

Other Embodiment

As shown in the embodiment illustrated in FIG. 1, the present invention is not limited to a case in which only the KNN piezoelectric thin film element 3 of a single layer structure is present between the lower electrode 2 and the upper electrode 4. For example, when a plurality of $(K_{1-x}Na_x)NbO_3$ (0<X<1) layers are present between the upper and lower electrodes, at least the thickest same composition layer made of $(K_{1-x}Na_x)NbO_3$ (0<X<1) out of these plurality of layers may satisfy $0.98 \leq c/a \leq 1.01$. A single or a plurality of thin films made of a material other than $(K_{1-x}Na_x)NbO_3$ (0<X<1) may be inserted into any position between the upper and lower electrodes.

The same composition layer of KNN thin film in this specification means the layer where the fluctuation of each one of the Na/(K +Na) composition, (K +Na)/Nb composition, and (K +Na +Na)/O composition in a direction of the film thickness is within a range of ±10%.

Thus, in a case of a structure of a plurality of layers or a multi-layer structure between the upper and lower electrodes, the in-plane directional lattice constant a is set as a value calculated by using the X-ray diffraction pattern obtained by the in-plane X-ray diffraction measurement, with the KNN thin film of the thickest same composition layer of exposed to the surface.

Note that it is also acceptable to add any one of or a plurality of Ta, Li, and Sb, to any one of the layer or a plurality of layers, in a case of the KNN piezoelectric thin film 3 of a single layer structure and the structure of a plurality of layers between the upper and lower electrodes.

EXAMPLES

Examples of the present invention will be described hereunder.

Figure 8:
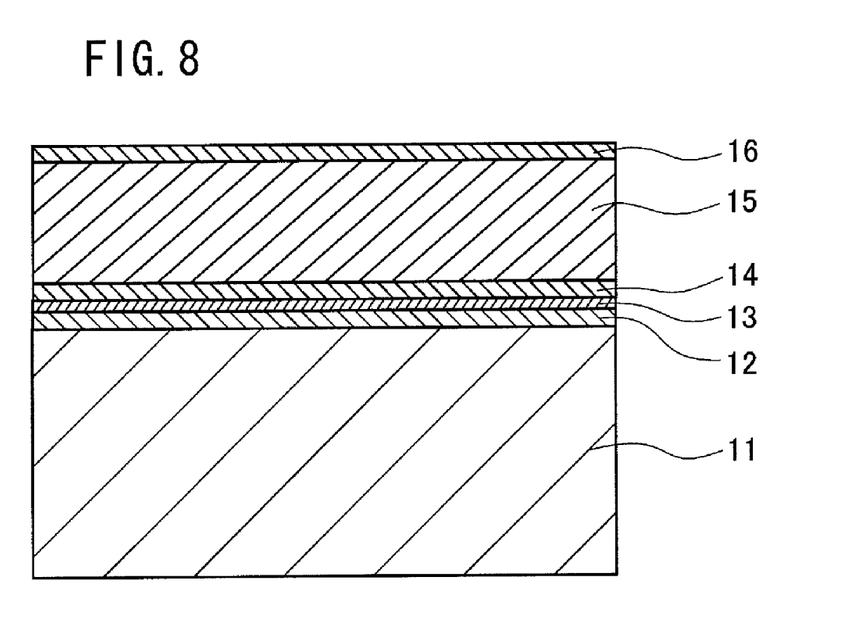
FIG. 8 is a schematic sectional view of the piezoelectric thin film elemental device fabricated in examples and comparative examples.

FIG. 8 illustrates a schematic sectional structure of the piezoelectric thin film elemental device of examples and comparative examples. The piezoelectric thin film elemental device is constituted, so that a Ti adhesive layer 13, a Pt lower electrode 14, a $(K_{1-x}Na_x)NbO_3$ piezoelectric thin film (KNN thin film) 15, and a Pt upper electrode 16 are sequentially formed on a Si substrate 11 (a $SiO_2$ film 12 is formed on the surface by thermal oxidation).

Next, a fabricating method of the piezoelectric thin film elemental device of the examples and the comparative examples will be described.

The Si substrate with a thermal oxide film ((100) Si, thickness of 0.5 mm, size of 20 mm×20 mm, thickness of 200 nm of the $SiO_2$ film on the surface) was used as the Si substrate 11. First, the Ti adhesive layer 13 (film thickness of 2 nm) and the Pt lower electrode 14 (preferentially (111) orientation and having film thickness of 200 nm) 14 were formed on the Si substrate 11 by the RF magnetron sputtering technique. The deposition of the Ti adhesive layer 13 and the Pt lower electrode 14 was performed under conditions of a substrate temperature set at 300° C., discharge power set at 200 W, in introduction gas Ar atmosphere, pressure set at 2.5 Pa, and the deposition time set at 1 to 3 minutes for the Ti adhesive layer 13 and the deposition time set at 10 minutes for the Pt lower electrode 14.

Subsequently, 3 µm of the $(K_{1-x}Na_x)NbO_3$ thin film 15 was formed on the Pt lower electrode 14 by the RF magnetron sputtering technique. The $(K_{1-x}Na_x)NbO_3$ thin film 15 was deposited under the conditions of the substrate temperature set at 500 to 700° C., the discharge power set at 100 W, in the instruction gas Ar atmosphere, and the pressure set at 0.4 Pa, with the $(K_{1-x}Na_x)NbO_3$ sintered body having a composition formula (K+Na)/Nb=1.0, Na/(K+Na)=0.3 to 0.9 used as a target. The deposition time was set at 4 hours.

Further, the Pt upper electrode 16 (film thickness 20 nm) was formed on the $(K_{1-x}Na_x)NbO_3$ thin film 15 by the RF magnetron sputtering technique. The Pt upper electrode 16 was deposited under the conditions of no substrate heating, the discharge power set at 200 W, in the introduction gas Ar atmosphere, the pressure set at 2.5 Pa, and the deposition time set at 1 minute.

In addition, heat treatment (annealing) at 650° C. for 8 hours in the atmospheric air was performed to several samples of the examples and the comparative examples, after deposition (after completely lowering the temperature to the room temperature after deposition by the RF magnetron sputtering technique).

Tables 1 to 3 show a list of the deposition temperature (° C.) of the KNN thin film, Na composition (x=Na/(K+Na) composition) of the KNN thin film, a rate of orientation (%) in the KNN (001) plane direction of the KNN thin film, out-of-plane directional lattice constant c (nm), in-plane directional lattice constant a (nm), c/a ratio, and piezoelectric constant $d_{31}$ (−pm/V) according to examples and comparative examples of the present invention.

TABLE 1

|  | Comparative example 1 | Comparative example 2 | Example 1 | Comparative example 3 | Comparative example 4 | Example 2 | Comparative example 5 | Comparative example 6 | Example 3 |
|---|---|---|---|---|---|---|---|---|---|
| Na composition | 0.4 | 0.55 | 0.7 | 0.75 | 0.8 | 0.3 | 0.4 | 0.5 | 0.6 |
| Orientation rate of (001) plane | 95 | 90 | 100 | 70 | 60 | 90 | 90 | 94 | 55 |
| Deposition temperature | 500 | 500 | 500 | 500 | 500 | 600 | 600 | 600 | 600 |
| Presence/absence of annealing | absence | presence | absence | absence | absence | presence | absence | presence | absence |
| Out-of-plane lattice constant c | 0.4132 | 0.3915 | 0.3912 | 0.3845 | 0.3797 | 0.4104 | 0.4129 | 0.3958 | 0.3944 |
| In-plane lattice constant a | 0.3994 | 0.4062 | 0.3987 | 0.3992 | 0.3993 | 0.4065 | 0.3993 | 0.4061 | 0.3996 |
| c/a ratio | 1.0346 | 0.9638 | 0.9813 | 0.9631 | 0.9510 | 1.0094 | 1.0338 | 0.9746 | 0.9868 |
| d31 (−pm/V) | 60 | 65 | 95 | 64 | 60 | 93 | 70 | 71 | 106 |

TABLE 2

|  | Comparative example 7 | Comparative example 8 | Comparative example 9 | Comparative example 10 | Example 4 | Example 5 | Comparative example 11 | Comparative example 12 | Comparative example 13 |
|---|---|---|---|---|---|---|---|---|---|
| Na composition | 0.5 | 0.8 | 0.45 | 0.3 | 0.4 | 0.5 | 0.55 | 0.75 | 0.6 |
| Orientation rate of (001) plane | 100 | 100 | 98 | 93 | 56 | 70 | 72 | 77 | 89 |
| Deposition temperature | 600 | 600 | 700 | 650 | 650 | 650 | 650 | 650 | 650 |
| Presence/absence of annealing | absence | absence | absence | absence | presence | absence | presence | absence | presence |
| Out-of-plane lattice constant c | 0.4064 | 0.3839 | 0.4101 | 0.4207 | 0.3995 | 0.4034 | 0.3899 | 0.3854 | 0.3878 |
| In-plane lattice constant a | 0.3989 | 0.3983 | 0.3989 | 0.3994 | 0.4070 | 0.3995 | 0.4063 | 0.3988 | 0.4059 |
| c/a ratio | 1.0186 | 0.9636 | 1.0278 | 1.0534 | 0.9818 | 1.0099 | 0.9595 | 0.9663 | 0.9555 |
| d31 (−pm/V) | 73 | 58 | 66 | 62 | 97 | 94 | 69 | 64 | 50 |

TABLE 3

|  | Comparative example 14 | Example 6 | Comparative example 15 | Comparative example 16 | Example 7 | Comparative example 17 | Example 8 | Example 9 | Comparative example 18 |
|---|---|---|---|---|---|---|---|---|---|
| Na composition | 0.9 | 0.35 | 0.3 | 0.4 | 0.5 | 0.6 | 0.7 | 0.4 | 0.7 |
| Orientation rate of (001) plane | 81 | 100 | 100 | 90 | 54 | 100 | 92 | 91 | 55 |
| Deposition temperature | 650 | 700 | 700 | 700 | 700 | 700 | 700 | 700 | 700 |
| Presence/absence of annealing | absence | presence | absence | absence | absence | presence | absence | presence | absence |
| Out-of-plane lattice constant c | 0.3745 | 0.4078 | 0.4215 | 0.4130 | 0.4019 | 0.3890 | 0.3907 | 0.4031 | 0.3870 |
| In-plane lattice constant a | 0.3985 | 0.4061 | 0.3992 | 0.3992 | 0.3997 | 0.4056 | 0.3986 | 0.4062 | 0.3993 |
| c/a ratio | 0.9400 | 1.0041 | 1.0559 | 1.0346 | 1.0055 | 0.9591 | 0.9803 | 0.9924 | 0.9692 |
| d31 (−pm/V) | 45 | 105 | 71 | 73 | 103 | 59 | 95 | 100 | 45 |

The Na composition of the KNN thin film 15 was calculated from atom concentration percentage of K, Na, measured by an energy dispersive X-ray analyzer, from the surface side of the KNN thin film 15. Also, the rate of orientation of the KNN thin film 15 in the KNN (001) plane direction was calculated from a spectrum (see FIG. 4) obtained by a general X-ray diffraction measurement (2θ/θ method) using the CuKα$_1$ ray shown in FIG. 3. Note that the measurement by the energy dispersive X-ray analyzer and the X-ray diffraction measurement were performed, with the KNN thin film 15 exposed, in a state before the Pt upper electrode 16 was formed.

In this specification, the rate of orientation (%) of the KNN thin film 15 in the (001) plane direction is defined as a value calculated by a calculating formula of {(KNN (001) plane diffraction peak intensity)/(sum of the diffraction peak intensity caused by all KNN crystals)}×100, performed to the diffraction peak caused by the KNN crystals in a range of 20°≦2θ≦38° of the X-ray diffraction pattern (2θ/θ method). Note that the diffraction peak in a range of 22.011°≦2θ≦22.890° in the X-ray diffraction pattern is considered to be the diffraction peak by the KNN (001) plane based on the JCPDS-international Center for Diffraction Data of KNbO$_3$ and NaNbO$_3$, if the pseudo-cubic crystal of the KNN in the thin film on the substrate is taken into account.

Figure 9A:
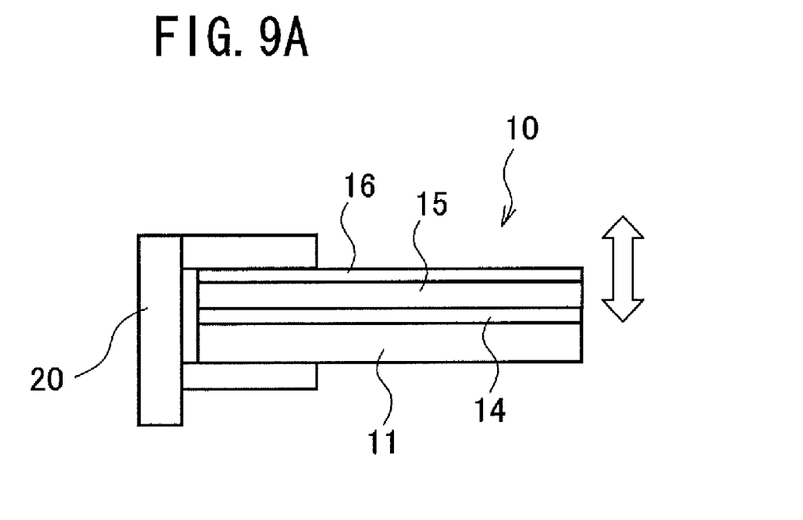
FIG. 9A is a schematic block diagram illustrating a measurement method of a piezoelectric constant $d_{31}$ of the piezoelectric thin film elemental device.
Figure 9B:
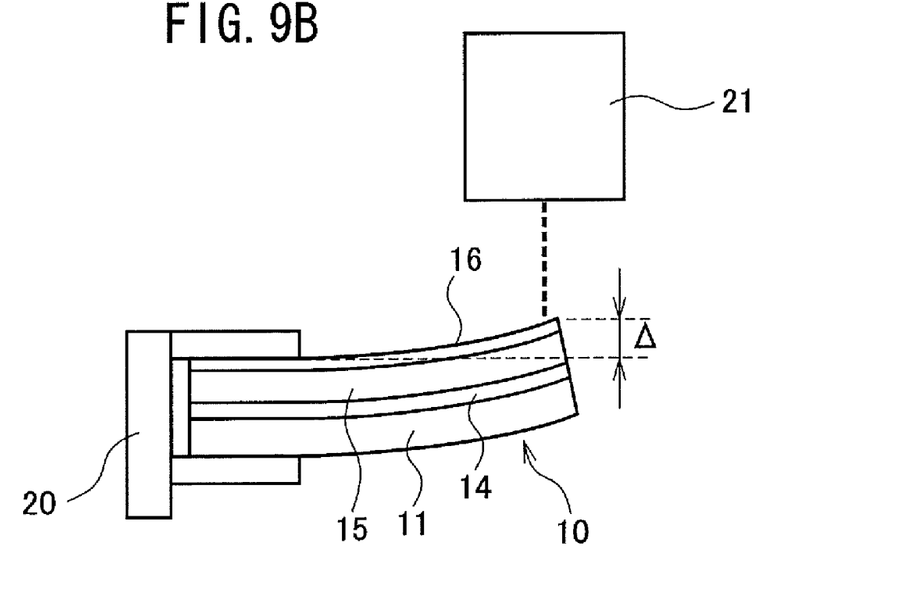
FIG. 9B is a schematic block diagram illustrating the measurement method of the piezoelectric constant $d_{31}$ of the piezoelectric thin film elemental device.

In addition, the piezoelectric constant d$_{31}$ was obtained by the following method in this specification. The measurement of the piezoelectric constant d$_{31}$ was performed by preparing a unimorph cantilever having a structure shown in FIG. 9A and FIG. 9B. First, the piezoelectric thin film elemental device of FIG. 8 was cut in rectangles, with length set at 20 mm and width set at 2.5 mm, and an elongated piezoelectric thin film elemental device 10 was fabricated. Next, by fixing longitudinal one end of the piezoelectric thin film elemental device 10 by a clamp 20, a simplified unimorph cantilever was constituted (FIG. 9A). In this state, the voltage was applied between the upper electrode 16 and the lower electrode 14, to thereby extend and contract the KNN piezoelectric thin film 15, so that an overall body of the cantilever (piezoelectric thin film elemental device 10) was made to bend, and a displacement Δ in a vertical direction (film thickness direction of the KNN piezoelectric thin film 15) of a tip end (free end) of the cantilever was measured by a Laser Doppler displacement gage 21 (FIG. 9B).

The piezoelectric constant $d_{31}$ was calculated by the displacement Δ of the tip end of the cantilever, a length of the cantilever, thickness and the Young's modulus of the substrate 11 and the KNN piezoelectric thin film 15, and an applying electric field (=applying voltage/film thickness). A method described in a document (T. Mino, S. Kuwajima, T. Suzuki, I. Kanno, H. Kotera, and K. Wasa, Jpn.J.Appl.phys., 46(2007), 6960) was adopted as a calculation method of the piezoelectric constant $d_{31}$. The value of the piezoelectric constant $d_{31}$ at the time of the applying electric field of 30 kV/cm was measured. 104 GPa was used as the Young's modulus of the KNN thin film.

Figure 10:
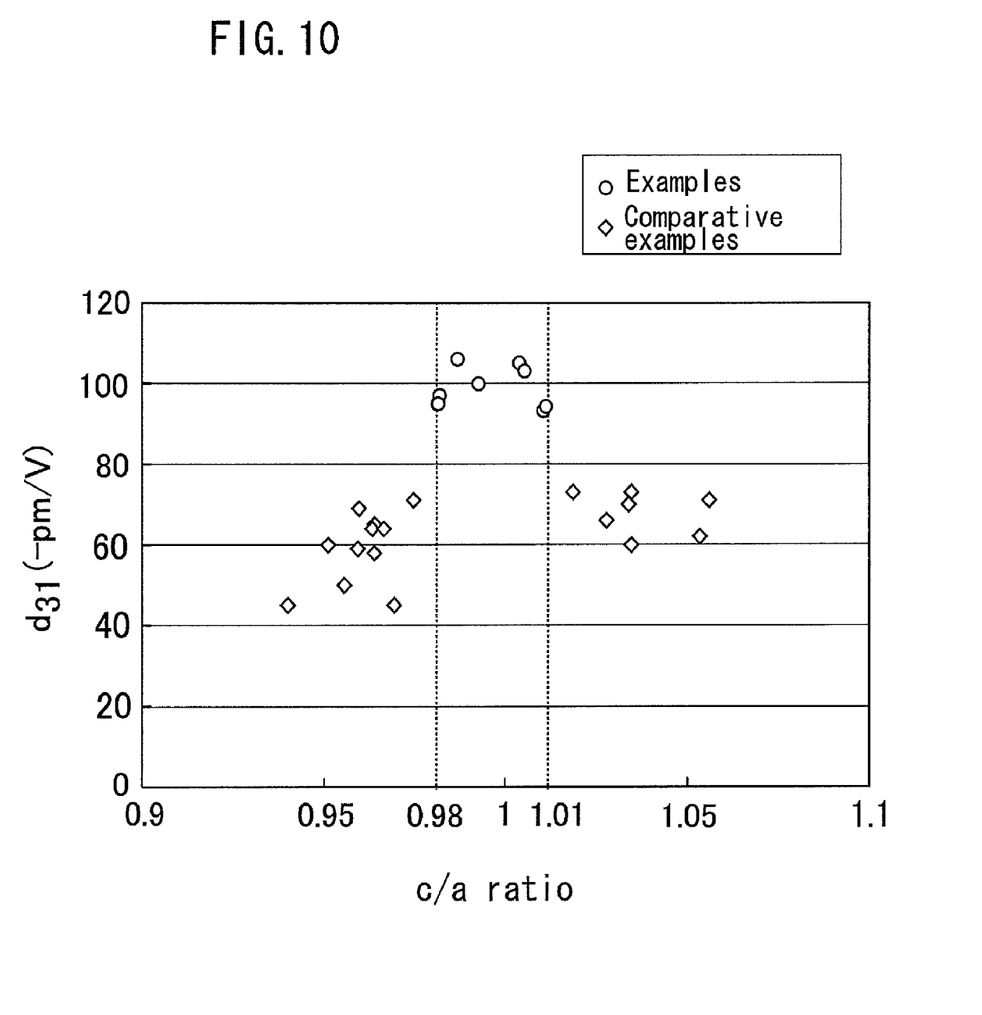
FIG. 10 is a graph illustrating a relation between c/a ratio and the piezoelectric constant $d_{31}$ in the examples and the comparative examples.

FIG. 10 illustrates a relation between the c/a ratio and the piezoelectric constant $d_{31}$ of the tables 1 to 3. It is found from this graph, that a high piezoelectric constant such as $|d_{31}| \geq 90$ pm/V is obtained when the c/a ratio is in the range of $0.98 \leq c/a \leq 1.01$, but when the c/a ratio is outside of this range, the value of $d_{31}$ drastically drops.

Also, regarding a condition/parameter for changing the c/a ratio, schematically the following tendency can be recognized from the tables 1 to 3. For example, if the rate of (001) plane orientation is set large, the out-of-plane directional lattice constant c becomes larger, the in-plane directional lattice constant a becomes smaller, and the c/a ratio becomes larger. If the Na composition of the KNN thin film is set large, both of the out-of-plane directional lattice constant c and the in-plane directional lattice constant a become smaller, and the c/a ratio becomes smaller. Also, if annealing is performed after deposition, the out-of-plane directional lattice constant c becomes smaller, the in-plane directional lattice constant a becomes larger, and the c/a ratio becomes smaller. Further, if the deposition temperature is set high, the out-of-plane directional lattice constant c becomes smaller, the in-plane directional lattice constant a becomes smaller, and the c/a ratio becomes smaller.

Actually, in addition to the aforementioned Na composition, the rate of (001) plane orientation, the deposition temperature, and the presence/absence of annealing process, many conditions/parameters such as deposition conditions (discharge power, introduction gas atmosphere, and pressure) seems to be intricately involved as the conditions/parameters for changing the c/a ratio of the KNN thin film. However, it is found from the results of the tables 1 to 3, that the c/a ratio can be controlled/changed by changing the rate of (001) plane orientation, the Na composition, the deposition temperature, and the annealing process.

What is claimed is:

1. A piezoelectric thin film elemental device comprising: a piezoelectric thin film on a substrate, wherein the piezoelectric thin film has a $(K_{1-x}Na_x)NbO_3$ thin film expressed by a compositional formula $(K_{1-x}Na_x)NbO_3 (0<x<1)$ with a perovskite structure, and a ratio of an out-of-plane directional lattice constant c to an in-plane directional lattice constant a of the thin film is in a range of $0.98 \leq c/a \leq 1.01$.

2. The piezoelectric thin film elemental device according to claim 1, wherein when there are a plurality of $(K_{1-x}Na_x)NbO_3$ $(0<x<1)$ layers in the piezoelectric thin film, the ratio in at least the thickest same composition layer made of $(K_{1-x}Na_x)NbO_3$ out of these plurality of layers is within the range of $0.98 \leq c/a \leq 1.01$.

3. The piezoelectric thin film elemental device according to claim 1, wherein the $(K_{1-x}Na_x)NbO_3$ thin film is preferentially-oriented in a (001) plane direction.

4. The piezoelectric thin film elemental device according to claim 1, wherein the $(K_{1-x}Na_x)NbO_3$ thin film is formed by an RF magnetron sputtering technique.

5. The piezoelectric thin film elemental device according to claim 1, wherein at least one kind of Ta, Li, Sb is added to the $(K_{1-x}Na_x)NbO_3$ thin film.

6. The piezoelectric thin film elemental device according to claim 1, wherein the x, being a composition ratio of Na, is in a range of $0.3 \leq x \leq 0.7$.

7. The piezoelectric thin film elemental device according to claim 1, wherein a tensile stress is added to in the piezoelectric thin film, and the ratio of the $(K_{1-x}Na_x)NbO_3$ thin film is in a range of $0.980 \leq c/a \leq 0.993$.

8. The piezoelectric thin film elemental device according to claim 7, wherein the piezoelectric thin film is provided on a stress relaxation layer with smaller lattice constant than that of the piezoelectric thin film.

9. The piezoelectric thin film elemental device according to claim 1, wherein a compression stress is generated in the piezoelectric thin film, and the ratio of the $(K_{1-x}Na_x)NbO_3$ thin film is in a range of $1.004 \leq c/a \leq 1.010$.

10. The piezoelectric thin film elemental device according to claim 9, wherein the piezoelectric thin film is provided on a stress relaxation layer with larger lattice constant than that of the piezoelectric thin film.

11. The piezoelectric thin film elemental device according to claim 1, wherein an electrode is formed between the substrate and the piezoelectric thin film.

12. The piezoelectric thin film elemental device according to claim 11, wherein the electrode is formed of Pt or Au.

13. The piezoelectric thin film elemental device according to claim 12, wherein the electrode formed of Pt is preferentially-oriented in a (111) plane direction.

14. The piezoelectric thin film elemental device according to claim 11, wherein the electrode is formed by an RF magnetron sputtering technique.

15. The piezoelectric thin film elemental device according to claim 11, wherein an adhesive layer is provided between the substrate and the electrode.

16. The piezoelectric thin film elemental device according to claim 1, wherein the substrate is a silicon substrate.

17. The piezoelectric thin film elemental device according to claim 16, wherein a $SiO_2$ film is formed on a surface of the silicon substrate.

18. The piezoelectric thin film elemental device according to claim 1, wherein an electrode is formed on the piezoelectric thin film.

19. An actuator, comprising:
   the piezoelectric thin film elemental device according to claim 1; and
   a voltage applying means for applying voltage to the piezoelectric thin film of the piezoelectric thin film elemental device.

20. A sensor, comprising:
   the piezoelectric thin film elemental device according to claim 1; and
   a voltage detector for detecting voltage generated in the piezoelectric thin film of the piezoelectric thin film elemental device.

* * * * *